(12) United States Patent
Agusti et al.

(10) Patent No.: US 12,740,026 B2
(45) Date of Patent: Sep. 15, 2026

(54) INTELLIGENT COOLING MANAGEMENT CONTROLLER

(71) Applicant: OVH, Roubaix (FR)

(72) Inventors: Maxime Agusti, Roubaix (FR); Mohamad Hnayno, La Madeleine (FR); Ali Chehade, Moncheaux (FR)

(73) Assignee: OVH, Roubaix (FR)

( * ) Notice: Subject to any disclaimer, the term of this patent is extended or adjusted under 35 U.S.C. 154(b) by 35 days.

(21) Appl. No.: 19/042,685

(22) Filed: Jan. 31, 2025

(65) Prior Publication Data

US 2025/0248009 A1 Jul. 31, 2025

(30) Foreign Application Priority Data

Jan. 31, 2024 (EP) .................................... 24305174

(51) Int. Cl.
*H05K 7/20* (2006.01)
*H05K 7/14* (2006.01)

(52) U.S. Cl.
CPC ....... *H05K 7/20836* (2013.01); *H05K 7/1498* (2013.01); *H05K 7/20709* (2013.01); *H05K 7/20763* (2013.01)

(58) Field of Classification Search
CPC ............. H05K 7/20836; H05K 7/1498; H05K 7/20709; H05K 7/20763
See application file for complete search history.

(56) References Cited

U.S. PATENT DOCUMENTS 9,207,732 B1 * 12/2015 Chen ....................... G06F 1/206
2010/0032142 A1 2/2010 Copeland et al.
2012/0020349 A1 * 1/2012 Dunwoody ........... G06F 15/161 709/250
2022/0117121 A1 4/2022 Heydari et al.
2023/0098687 A1 3/2023 Maillot et al.

OTHER PUBLICATIONS

European Search Report with regard to the EP Patent Application No. 24305174.5 issued May 22, 2024.

* cited by examiner

*Primary Examiner* — Michael W Choi
(74) *Attorney, Agent, or Firm* — BCF LLP

(57) ABSTRACT

The present invention describes an intelligent power management system designed for optimizing energy use in data center server assemblies. It can use various coolants, like liquid or gas, and adjusts to changing processor loads. The system integrates a coolant loop, a variable flow coolant circulator, and an advanced control unit. The advanced control unit dynamically regulates coolant flow, server temperature, and total power consumption, and receives temperature data from each server's baseboard management controller and power data from a power distribution unit. The advanced control unit computes the best coolant flow rate to minimize total power use while keeping server temperature below a safety limit, and uses either a static or a machine learning model with reinforcement learning and a reward mechanism to enhance real-time calculations and overall efficiency over time.

10 Claims, 7 Drawing Sheets

| $t_4$ | | |
| --- | --- | --- |
| S | $T^o_{CPU}$ | 70º C |
| | $P_{SERVER}$ | 103 W |
| | $P_{PUMP}$ | 15 W |
| R | +1 | |
| G | 5 | |

$\dot{m}$ = 0.5 L/min →

| $t_5$ | | |
| --- | --- | --- |
| S | $T^o_{CPU}$ | 85º C |
| | $P_{SERVER}$ | 123 W |
| | $P_{PUMP}$ | 15 W |
| R | -1 | |
| G | 4 | |

$\dot{m}$ = 0.6 L/min →

| $t_n$ | | |
| --- | --- | --- |
| S | $T^o_{CPU}$ | 75º C |
| | $P_{SERVER}$ | 123 W |
| | $P_{PUMP}$ | 15 W |
| R | +4 | |
| G | 8 | |

Figure 4B

INTELLIGENT COOLING MANAGEMENT CONTROLLER

CROSS-REFERENCE

The present application claims priority to European Patent Appl. No. 24305174.5 filed Jan. 31, 2024, and entitled "INTELLIGENT COOLING MANAGEMENT CONTROLLER", the entirety of which is incorporated herein by reference.

FIELD

The present technology relates to cooling techniques for electronic equipment. In particular, an energy-efficient cooling arrangement for a server mountable in a server rack is disclosed.

BACKGROUND

Electronic equipment, for example servers, memory banks, computer discs, and the like, is conventionally grouped in equipment racks. Large data centers and other large computing infrastructures may contain thousands of racks supporting thousands or even tens of thousands of servers.

The equipment mounted in the racks consumes large amounts of electric power and generate significant amounts of heat. Cooling needs are important in such racks. Some electronic devices, such as processors, generate so much heat that they could fail within seconds in case of a lack of cooling.

Forced air-cooling has been traditionally used to disperse heat generated by processors and other heat-generating components of servers mounted in server racks. Air-cooling requires the use of powerful fans, the provision of space between servers or between components of a server for placing heat sinks and for allowing sufficient airflow, and is generally not very efficient.

Liquid-cooling technologies, for example using liquid-cooling, is increasingly used to as an efficient and cost-effective solution to preserve safe operating temperatures of servers and like equipment mounted in racks. Liquid-cooling units, for example so-called water blocks, are mounted on heat-generating components, such as processors. Heat is absorbed by water flowing between these liquid-cooling units and heat exchange components located outside of the racks. The heated water flows from these liquid-cooling units to external, larger cooling units. Although quite efficient, the performance of liquid-cooling technology is limited by the specific heat capacity of water and by the available contact area between these heat-generating components and liquid-cooling units. The limited heat transfer area provided by typical processors and the specific heat capacity of water impose a limit on the effectiveness of liquid-cooling techniques.

Additionally, despite advances in both air-cooling and liquid-cooling technologies, some clients of large computing infrastructures are concerned about the power usage effectiveness of the cooling systems. This may particularly be the case when the server load is low and the fan (in case of air-cooling) or the pump (in case of liquid-cooling) maintains a constant rate of air or water flow respectively, which is designed to ensure efficient cooling during peak server loads.

No matter the cooling technology used to maintain a safe temperature of processors, servers, and other equipment mounted in the racks of data centers and like computing infrastructures, optimization of the power consumption levels of the cooling system needs to be considered when selecting a cooling technology. For example, server load may peak only at certain instances for a particular time duration. At other instances of time, the server runs at a lower load and generates lesser heat. Preventing oversized flow rate of air or water and consequently preventing over-consumption of the fan or the pump is possible by dynamically adjusting the flow rate depending on the heat generated by the processors and the power consumption of the servers.

With this said, there remains an interest in estimating the power consumed by the electronic processing equipment to control the operations of the fan or the pump to optimize power usage efficiency.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

SUMMARY

Embodiments of the present technology have been developed based on developers' appreciation of shortcomings associated with conventional cooling techniques and implementations.

In one aspect, various implementations of the present technology provide a power management system for optimizing the total power consumption level of one or more rack-mounted processing assemblies comprising cooling blocks, the power management system comprising:

- a coolant distribution loop configured to convey coolant supplied to the cooling blocks of the one or more of the rack-mounted processing assemblies and convey heated coolant received from the cooling blocks of the one or more rack-mounted processing assemblies;
- a coolant circulation flow device configured to adjust a flow rate of the coolant conveyed in the coolant distribution loop to the cooling blocks;
- a power distribution unit (PDU) communicably-coupled to a power supply unit (PSU) of the one or more rack-mounted processing assemblies and configured to measure power consumption of the one or more rack-mounted processing assemblies;
- a power control unit communicably-coupled to the coolant circulation flow device, the PDU, and the one or more rack-mounted processing assemblies, the power control unit configured to:
  - receive temperature data from a baseboard management controller (BMC) of the one or more rack-mounted processing assemblies via a management interface which enables communication between the power control unit and the BMC of the one or more rack-mounted processing assemblies;
  - receive power consumption data of the one or more rack-mounted processing assemblies from the PDU;
  - calculate an optimal flow rate for the coolant circulation flow device, based on the received temperature and power consumption data, to optimize the total power consumption level of the rack-mounted processing assemblies, ensuring that the temperature of each rack-mounted processor assembly remains below a predetermined safety limit; and communicate control instructions to the coolant circulation flow device to adjust the flow rate of the coolant conveyed in the coolant distribution loop in accordance with the calculated optimal flow rate.

In some implementations of the present technology, the coolant circulation flow device is selected from a group of coolant circulation flow devices comprising: a communicably-coupled pump for liquid coolant and a communicably-coupled fan for gas coolant.

In some implementations of the present technology, the power control unit is further configured to monitor and dynamically adjust the flow rate of the coolant circulation flow device based on detected changes in received temperature data of the one or more rack-mounted processing assemblies, ensuring that the temperature of each rack-mounted processor assembly remains below a predetermined safety limit.

In some implementations of the present technology, the power control unit is further configured to dynamically adjust the flow rate of the coolant circulation flow device based on real-time analysis of processing load data experienced by the one or more rack-mounted processing assemblies, ensuring that the temperature of each rack-mounted processor assembly remains below a predetermined safety limit.

In some implementations of the present technology, the power control unit is further configured to calculate the optimal flow rate based on the temperature of the coolant supplied to the cooling blocks, ensuring that the temperature of each rack-mounted processor assembly remains below a predetermined safety limit.

In some implementations of the present technology, the power control unit is further configured to:

receive temperature data from a baseboard management controller (BMC) of the one or more rack-mounted processing assemblies via a management interface;

receive power consumption data of the one or more rack-mounted processing assemblies from a power distribution unit (PDU);

calculate an optimal flow rate for a coolant circulation device based on the received temperature and power consumption data, ensuring that the temperature of each rack-mounted processor assembly remains below a predetermined safety limit;

adjust the flow rate of the coolant circulation device by sending a control signal from the power control unit to the coolant circulation device to achieve reduced energy consumption while maintaining the temperature of each rack-mounted processing assembly below a predetermined safety limit.

In some implementations of the present technology, the control signal is selected from a group of control signals comprising: pulse width modulation (PWM) signals and pulse amplitude modulation (PAM) signals.

In some implementations of the present technology, the management interface is selected from a group of management interfaces comprising: an Intelligent Platform Management Interface (IPMI) and Redfish.

In some implementations of the present technology, the step of calculating the optimal flow rate includes using a static model based on predetermined parameters, or employing a dynamic machine learning model implementing reinforcement learning with predefined exploration/exploitation strategies and reward functions.

In the context of the present specification, unless expressly provided otherwise, a computer system may refer, but is not limited to, an "electronic device", an "operation system", a "system", a "computer-based system", a "controller unit", a "monitoring device", a "control device" and/or any combination thereof appropriate to the relevant task at hand.

In the context of the present specification, unless expressly provided otherwise, the expression "computer-readable medium" and "memory" are intended to include media of any nature and kind whatsoever, non-limiting examples of which include RAM, ROM, disks (CD-ROMs, DVDs, floppy disks, hard disk drives, etc.), USB keys, flash memory cards, solid state-drives, and tape drives. Still in the context of the present specification, "a" computer-readable medium and "the" computer-readable medium should not be construed as being the same computer-readable medium. To the contrary, and whenever appropriate, "a" computer-readable medium and "the" computer-readable medium may also be construed as a first computer-readable medium and a second computer-readable medium.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where:

FIGS. 4A and 4B illustrate the fundamental concept of a machine learning model implementing reinforcement learning with predefined exploration/exploitation strategies and reward functions for calculating the optimal water flow rate;

DETAILED DESCRIPTION

Figure 1:
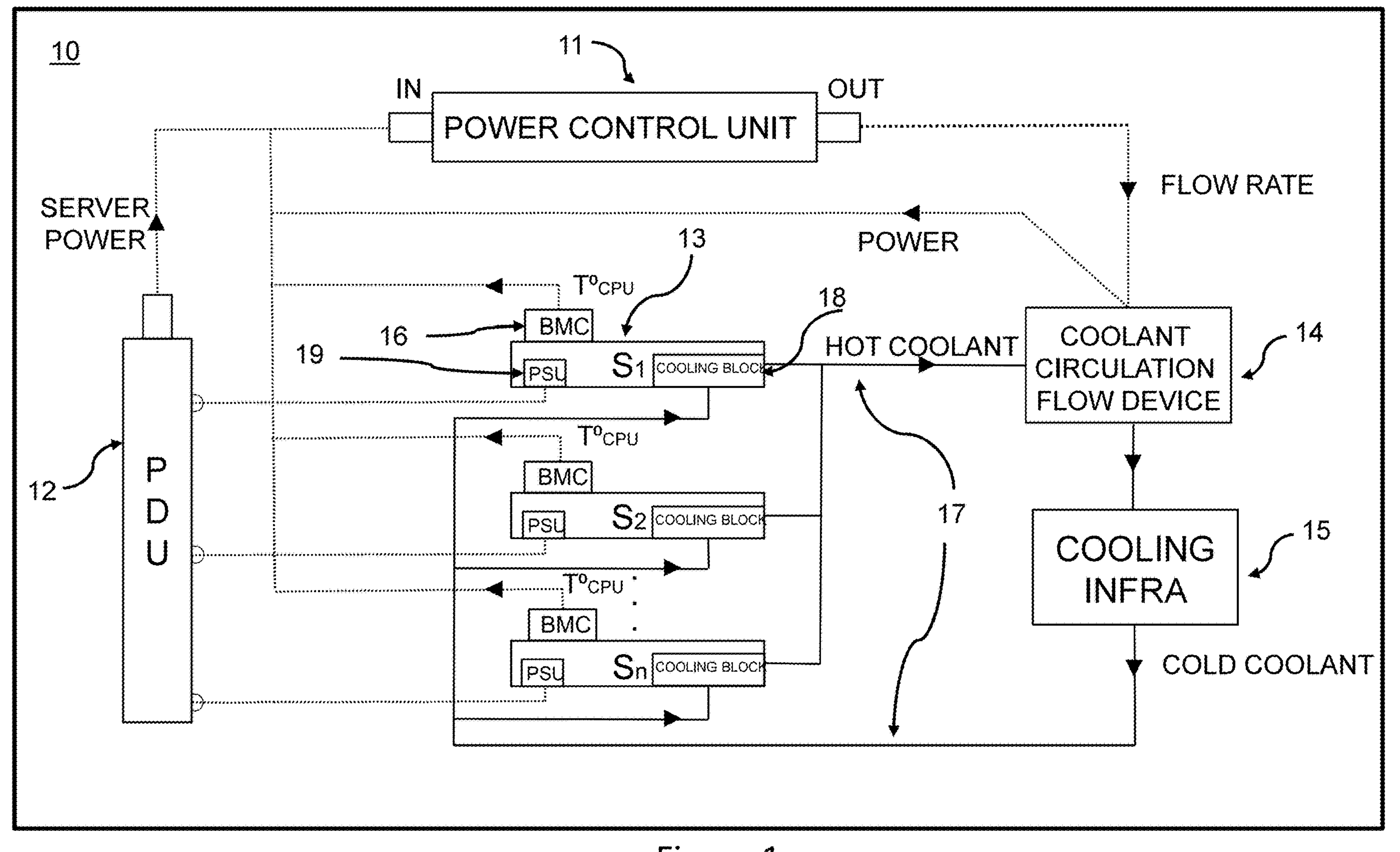
FIG. 1 illustrates a high-level functional block diagram of a cooling management system for datacenter rack-mounted processing assemblies with power estimation and related control of coolant circulation flow device (fan or pump), in accordance with the nonlimiting embodiments of the present technology.

The examples and conditional language recited herein are principally intended to aid the reader in understanding the principles of the present technology and not to limit its scope to such specifically recited examples and conditions. It will be appreciated that those skilled in the art may devise various arrangements that, although not explicitly described or shown herein, nonetheless embody the principles of the present technology.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative circuitry embodying the principles of the present technology. Similarly, it will be appreciated that any flowcharts, flow diagrams, state transition diagrams, pseudo-code, and the like represent various processes that may be substantially represented in non-transitory computer-readable media and so executed by a computer or processor, whether or not such computer or processor is explicitly shown.

In an aspect, the present technology introduces a power management system designed to optimize total power consumption in rack-mounted processing assemblies. This system integrates a coolant distribution loop with a flow-adjustable coolant circulation device, a power distribution unit (PDU), and a power control unit. The power control unit is the core of the system, equipped to receive and process temperature data from baseboard management controllers (BMCs) and power consumption data from the PDU. It computes the ideal coolant flow rate to maintain processor temperatures below a set safety threshold while optimizing overall power usage. The power control unit can dynamically adjust the coolant flow, considering both thermal and power consumption data. The system can accommodate both liquid and gas coolants, with the power control unit modifying the flow in real-time based on processing loads. The flow rate calculation can involve either a static model or an advanced machine learning model, ensuring efficient energy use and thermal management within the safety parameters.

With these fundamentals in place, we will now consider some non-limiting examples to illustrate various implementations of aspects of the present technology.

FIG. 1 illustrates a high-level functional block diagram of the cooling management system 10. The system 10 includes various interconnected components that work in concert to maintain optimal operating temperatures for the servers, thereby enhancing performance and reliability.

The system 10 includes a power distribution unit (PDU) 12 that serves as a primary electrical distribution point for server power. The PDU 12 is connected to multiple servers 13 denoted as $S_1$, $S_2$, . . . $S_n$, each equipped with a baseboard management controller 16 (BMC) and a power supply unit 19 (PSU). The servers 13 are powered by individual power supply units 19 receiving electric power from the PDU 12. In use, the BMC monitors a temperature of the server (e.g. a temperature of a central processing unit thereof) denoted $T°_{CPU}$ and relays this information to a power control unit 11 of the system 10. In addition, the PDU 12 determines an amount of electric power provided to each server 13, such that the PDU 12 may determine a power consumption of each server 13 in a near-to-real time manner. The PDU 12 may be implemented as disclosed in the European Patent Application No. 3,595,112.

The power control unit (PCU) 11 is a central management hub that receives information about a temperature of the servers 13 from the corresponding BMCs 16. For example, the PCU 11 may receive said information via a management interface selected from the group of interfaces including without being limited to: an Intelligent Platform Management Interface (IPMI) and REDFISH. REDFISH is a modern application programming interface (API) that offers a scalable and secure method for managing various hardware components in data centers and large-scale server environments. It can provide comprehensive functionality for managing and monitoring server states and allows for seamless integration with contemporary server architectures. On the other hand, IPMI is a more established protocol that provides an interface for monitoring the health of a server system. It operates at a lower level compared to REDFISH, allowing direct interaction with the hardware's baseboard management.

In use, the PCU 11 may regulate the electrical power distributed to the servers 13 based on their thermal load, optimizing energy consumption and preventing thermal overload.

In this implementation, the system 10 also a coolant distribution loop 17 that includes fluid cooling units 18 (only one of which is represented for each server 13 for simplicity) thermally coupled to the server 13 to be cooled. A cooling fluid (e.g. water or air), is made to flow through an internal conduit of the fluid cooling unit to absorb thermal from the corresponding server 13. As the cooling fluid flows out of the fluid cooling unit, so does the thermal energy collected thereby.

In some implementations, the cooling fluid is a cooling liquid and the fluid cooling units 18 are liquid cooling units (also called "water block", "cold plate", or "thermal transfer device"). It is to be understood that the term "liquid cooling unit" is intended to include such thermal transfer devices that use water, or any fluids other than water and/or multi-phase flow (e.g., two-phase flow). For example, in some instance, the fluid may be an oil, an alcohol, or a dielectric heat transfer fluid (e.g., 3M Novec®). Circulation of the cooling liquid in the internal conduit permits absorption of thermal energy from the servers 13. As an example, the liquid cooling unit may define a fluid inlet and a fluid outlet for respectively feeding and discharging the cooling liquid from the internal fluid conduit. As the cooling liquid flows out of the liquid cooling unit, so does the thermal energy absorbed thereby.

In some implementations, the cooling fluid is air and the fluid cooling units 18 are implemented as heat sinks or the like.

As will be described in greater detail hereinafter, the PCU 11 may also modulate a flow rate of the cooling fluid through the fluid cooling units 18. To do so, the system 10 includes a coolant circulation flow device 14 (e.g. a pump of a fan) to maintain a flow of the cooling fluid such that collection and carriage of thermal energy by the cooling fluid is properly maintained.

The PCU 11 modulates the flow rate of the cooling fluid by sending a control signal to the coolant circulation device 14. The control signal may be, for example and without limitation, a pulse amplitude modulation (PAM) signal or pulse width modulation (PWM) signal. If a PAM signal is employed, the PCU 11 adjusts the amplitude of the control signal to regulate the power delivered to the coolant circulation device 14, allowing for varied flow rates and energy-efficient operation. Alternatively, if a PWM signal is used, the PCU 11 will vary the duration of the pulses in the control signal, which enables precise control over the coolant circulation device's speed and subsequently its flow rate.

As shown, the coolant distribution loop 17 circulates the flow of hot cooling fluid away from the servers 13 towards a cooling infrastructure 15, where the cooling fluid is cooled down. The cooling infrastructure 15 then sends cold cooling fluid back to the servers 13, completing the closed-loop cooling cycle.

Therefore, the cooling infrastructure 15 indirectly maintains the servers 13 at their ideal operating temperatures. It receives the hot cooling fluid, cools it, and outputs cold cooling fluid back to the fluid cooling units 18. This process is continually adjusted by the power control unit 11 based on the servers' real-time temperature data, thus maintaining a dynamic balance between cooling efficiency and energy usage.

It should be noted that, even though the illustrative examples are related to providing cooling using a liquid coolant, teachings of the present technology may be applied to air-cooling systems where air is used to cool the server 13 instead of the liquid cooling. For example, in such air-cooling systems, the cooling infrastructure 15 may be an air-to-liquid heat exchanger configured to cool the air, the coolant circulation flow device 14 may include fans to circulate air around the servers 13, etc.

Figure 2:
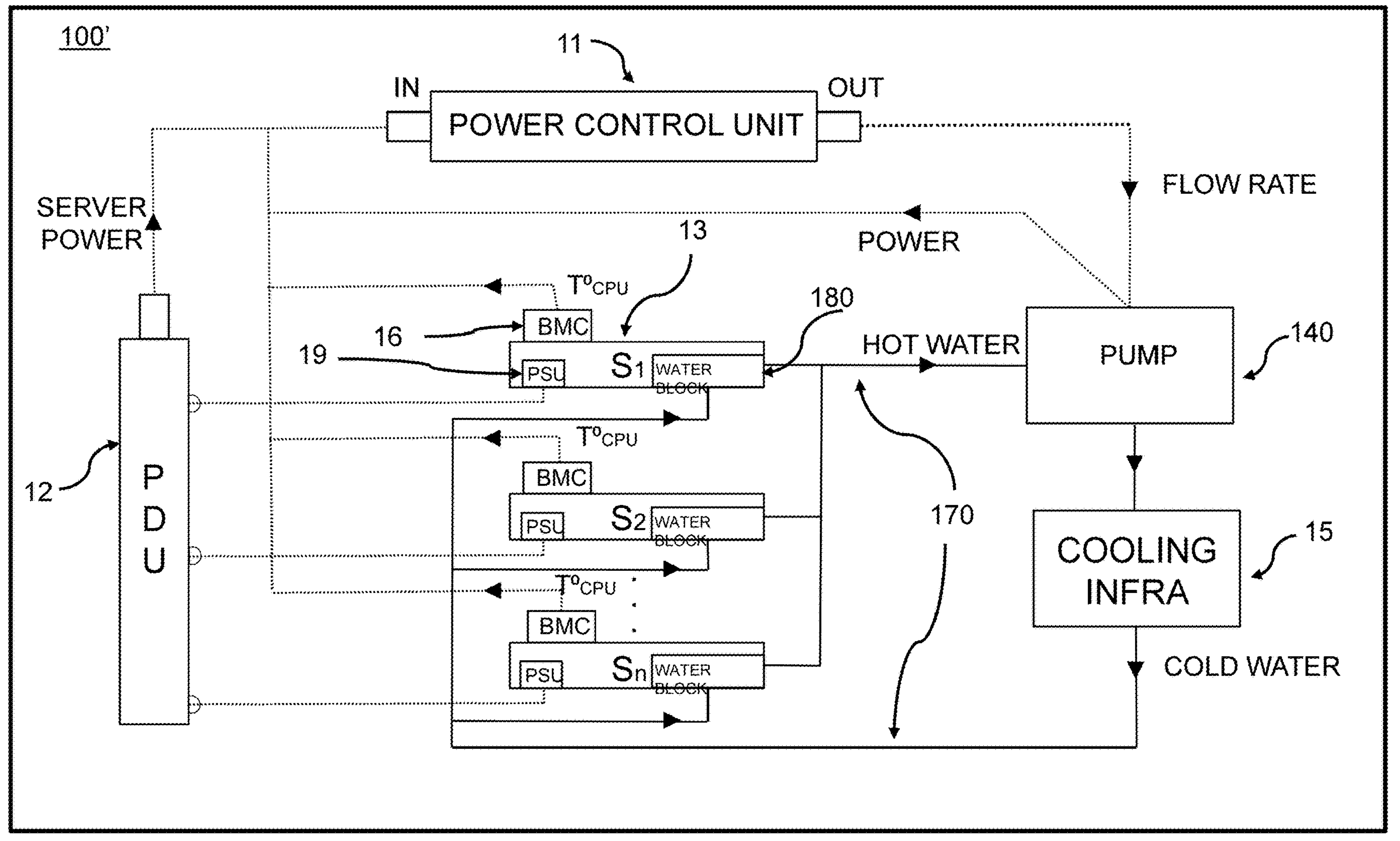
FIG. 2 is a top plan view of a liquid-cooling system employing a pump in accordance with an embodiment of the present technology.

In the top plan view illustrated in FIG. 2, the present technology is exemplified by a liquid-cooling system 100. Because the liquid-cooling system 100 contains similar components with like reference numerals as liquid-cooling system 10, for the sake of brevity, detailed descriptions of such components will not be repeated unless necessary for the understanding of the embodiment.

The system 100 is designed for thermal management of rack-mounted processing assemblies within a data center environment, utilizing a pump with variable speed drive 140, within its operational framework.

Figure 3:
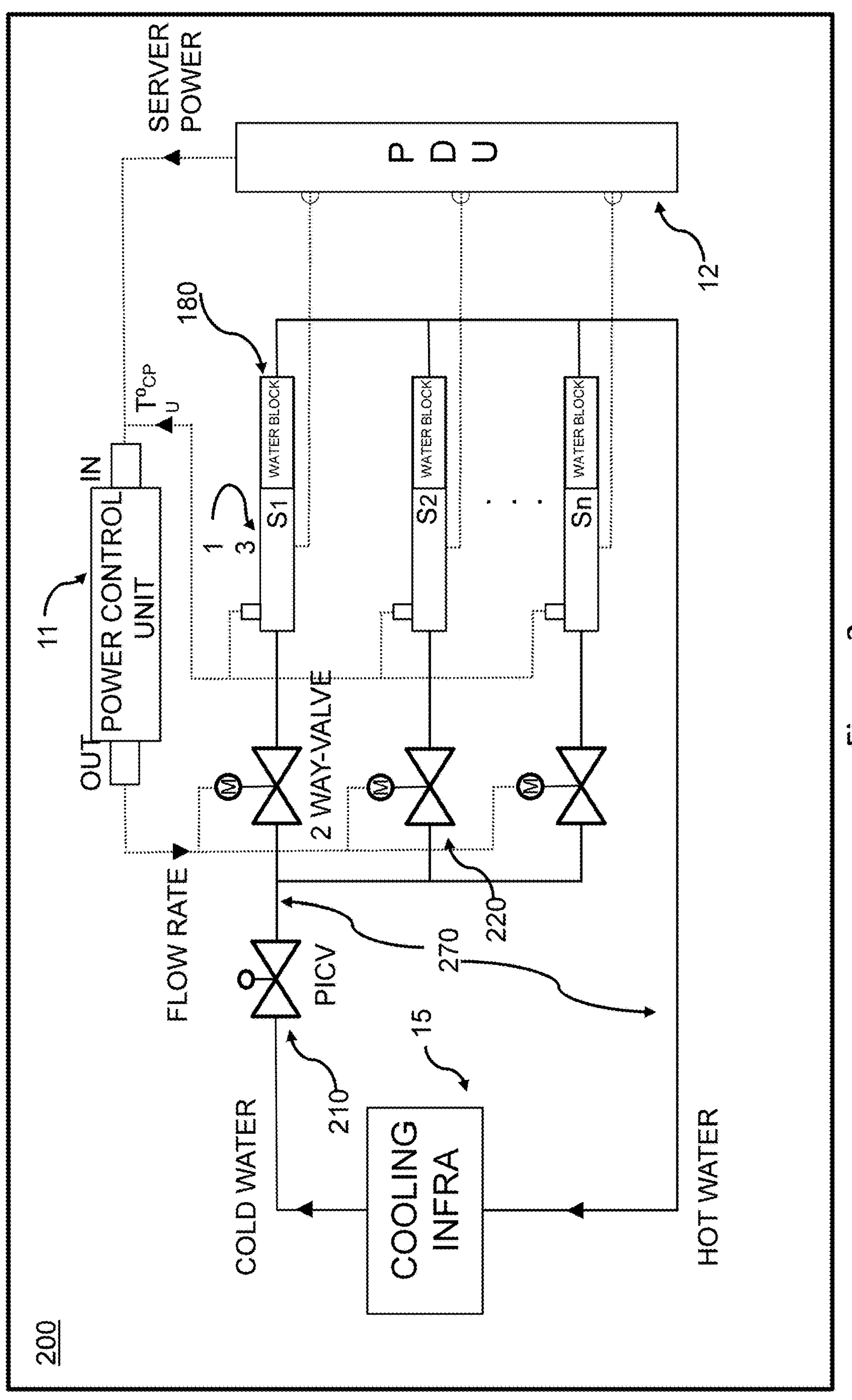
FIG. 3 is a top plan view of a liquid-cooling system employing a combination of AB-QM valves and two-way valves in accordance with an embodiment of the present technology.

In the top plan view illustrated in FIG. 3, the present technology is exemplified by a liquid-cooling system 200. Because the liquid-cooling system 200 contains similar components with like reference numerals as liquid-cooling system 10, for the sake of brevity, detailed descriptions of such components will not be repeated unless necessary for the understanding of the implementation.

System 200 is designed for thermal management of rack-mounted processing assemblies within a data center environment, utilizing a combination of pressure independent control valves (PICV) 210 and two-way valves 220 to regulate the flow of the cooling liquid.

As shown, the cooling infrastructure 15 receives hot cooling liquid and returns cold cooling liquid in the coolant distribution loop 17. The system includes AB-QM valves 210 positioned at an outlet of the cooling infrastructure 15 to control an amount of cold cooling liquid that is distributed into the coolant distribution loop 17.

In this implementation, a series of two-way valves 220 are provided and fluidly arranged in parallel configuration. In use the two-way valves 220 are operated to control the flow of cold cooling liquid to the fluid cooling units 180. In other words, these two-way valves 220 are used to adjust the amount of cooling liquid that the fluid cooling units 180 receive, ensuring that the temperature of the servers 13 is maintained within optimal limits. The use of both pressure independent control valves (PICV) and two-way valves allows for fine-tuned control of the cooling system's response to the dynamic thermal loads of the servers and also allows for controlling the minimum and maximum flow rates allowed per rack.

Figure 4A:
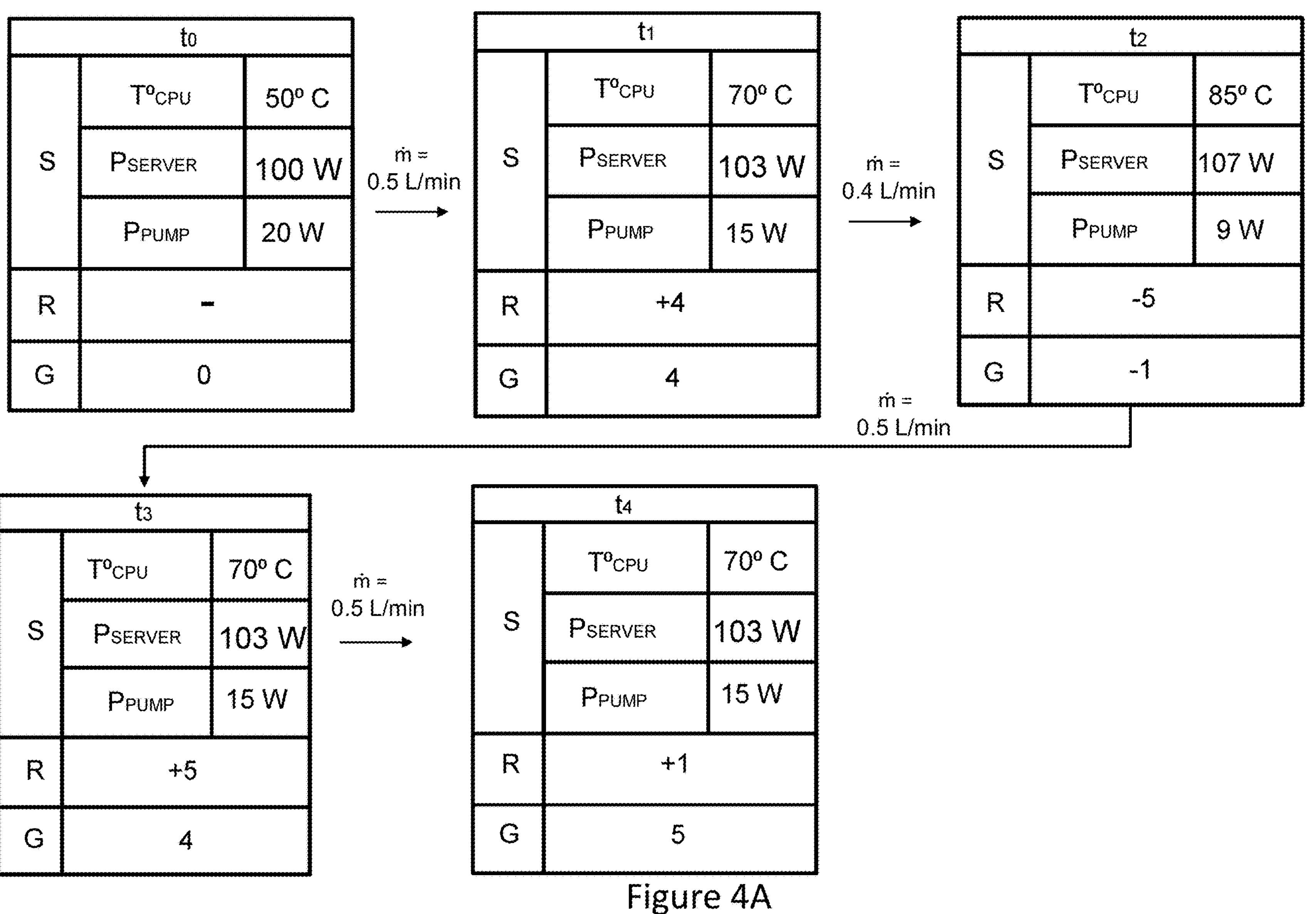

In some implementations, the PCU 11 employs a machine-learning algorithm (MLA) to determine an adjustment of the flow rate of the cooling fluid in the coolant loop 17. The PCU 11 may further cause the coolant circulation flow device 14 to perform said adjustment. FIGS. 4A and 4B exemplifies an application of a reinforcement learning approach to manage the cooling process within a server system through the manipulation of the flow rate of the cooling liquid. It is a sequential representation of time steps, from $t_0$ to $t_n$, showing how the system adapts its cooling strategy over time based on temperature of the servers 13, a power consumption thereof, and operation data of the coolant circulation device 14.

The following example relates to the cooling of a given server 13 but can be applied to each of the servers 13 in a simultaneous manner. At each time step, the state (S) is described by the temperature of the server 13 ($T°_{CPU}$), a power consumption ($P_{SERVER}$) of the server 13, and the power consumption ($P_{PUMP}$) of the pump 140. In this example, the coolant circulation device 14 is the pump 140 such that the operation data of the coolant circulation device 14 is the power consumption ($P_{PUMP}$) of the pump 140. The power consumption $P_{PUMP}$ is related to a rotation speed of the pump 140, which is indicative of a speed of the flow of the cooling liquid in the coolant loop 17. However, in alternative implementations, where the coolant circulation device 14 is a fan, the operation data of the coolant circulation device 14 may be indicative of a rotation speed of the fan.

The flow rate ($\dot{m}$) of the cooling fluid is modified based on the observed state, with the aim to optimize the overall power efficiency while maintaining safe operating temperatures.

The reinforcement learning model utilizes reward (R) and goal (G) metrics to evaluate the effectiveness of the actions taken at each time step. The reward is a numerical value that assesses the immediate impact of the action, while the goal is a cumulative metric that reflects the long-term achievement of the system's objectives.

For instance, at time $t_0$, the CPU temperature is at 50° C. with the server and pump power consumption at 100 W and 20 W, respectively, and the goal (G) starting at 0. At time $t_0$, the PCU applies an arbitrary flow rate ($\dot{m}$), in this case 0.5

L/min. The effect of this change is to decrease the pump power from 20 W to 15 W, increase the processor temperature from 50° C. to 70° C. at time $t_1$ and increase the server power from 100 W to 103 W. Hence, at time $t_1$, the CPU temperature rises to 70° C., the server power increases slightly, and the pump power decreases, resulting in a change in coolant flow rate ($\dot{m}$) and a positive reward (R) being assigned, indicating an improved outcome from the action taken.

Conversely, at time $t_2$, an unfavorable outcome is indicated by a negative reward (R) as the CPU temperature reaches 85° C., which is above a preferred threshold, showing the need for adjustment in the system's strategy. The learning model then adjusts the flow rate again, seeking to bring the system back to optimal conditions, as evidenced in subsequent time steps $t_3$ to $t_n$, where rewards and goals are adjusted based on the system's performance.

Through this method, the system learns to regulate the coolant flow rate dynamically, reducing overall power consumption and maintaining the CPU temperature within desired limits. This process illustrates the system's ability to self-optimize through reinforcement learning, constantly adjusting to find a balance between energy efficiency and cooling effectiveness.

Figure 5:
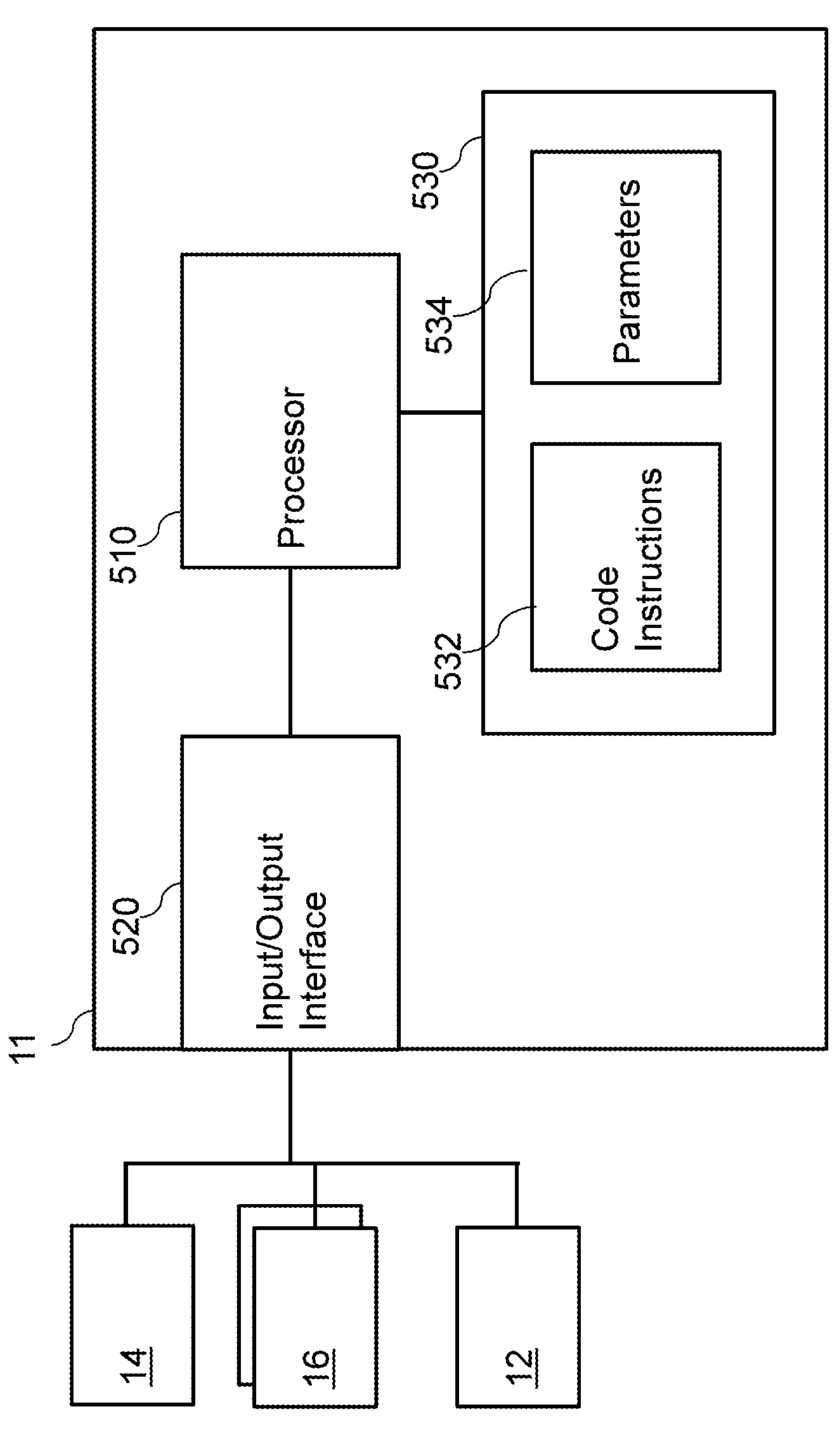
FIG. 5 is a schematic block diagram of a power control unit in accordance with some implementations of the present technology.

As an example, FIG. 5 is a schematic block diagram of the power control unit 11 of the systems 10, 100 and 200 according to an implementation of the present technology. The power control unit 11 comprises a processor or a plurality of cooperating processors (represented as a processor 510 for simplicity), a memory device or a plurality of memory devices (represented as a memory device 530 for simplicity), and an input/output interface 520 allowing the power control unit 11 to communicate with other components of the systems 10, 100 or 200 and/or other components in remote communication with the systems 10, 100 or 200. The processor 510 is operatively connected to the memory device 530 and to the input/output interface 520. The memory device 530 includes a storage for storing parameters 534. The memory device 530 may comprise a non-transitory computer-readable medium for storing code instructions 532 that are executable by the processor 510 to allow the power control unit 11 to perform the various tasks allocated to the power control unit 11 in the method 600 (see FIG. 6).

The power control unit 11 is operatively connected, via the input/output interface 520, to the coolant circulation flow device 14, the BMCs 16 and the PDU 12. The power control unit 11 executes the code instructions 532 stored in the memory device 530 to implement the various above-described functions that may be present in a particular embodiment. FIG. 5 as illustrated represents a non-limiting embodiment in which the power control unit 11 orchestrates operations of the systems 10, 100 or 200. This particular embodiment is not meant to limit the present disclosure and is provided for illustration purposes.

Figure 6:
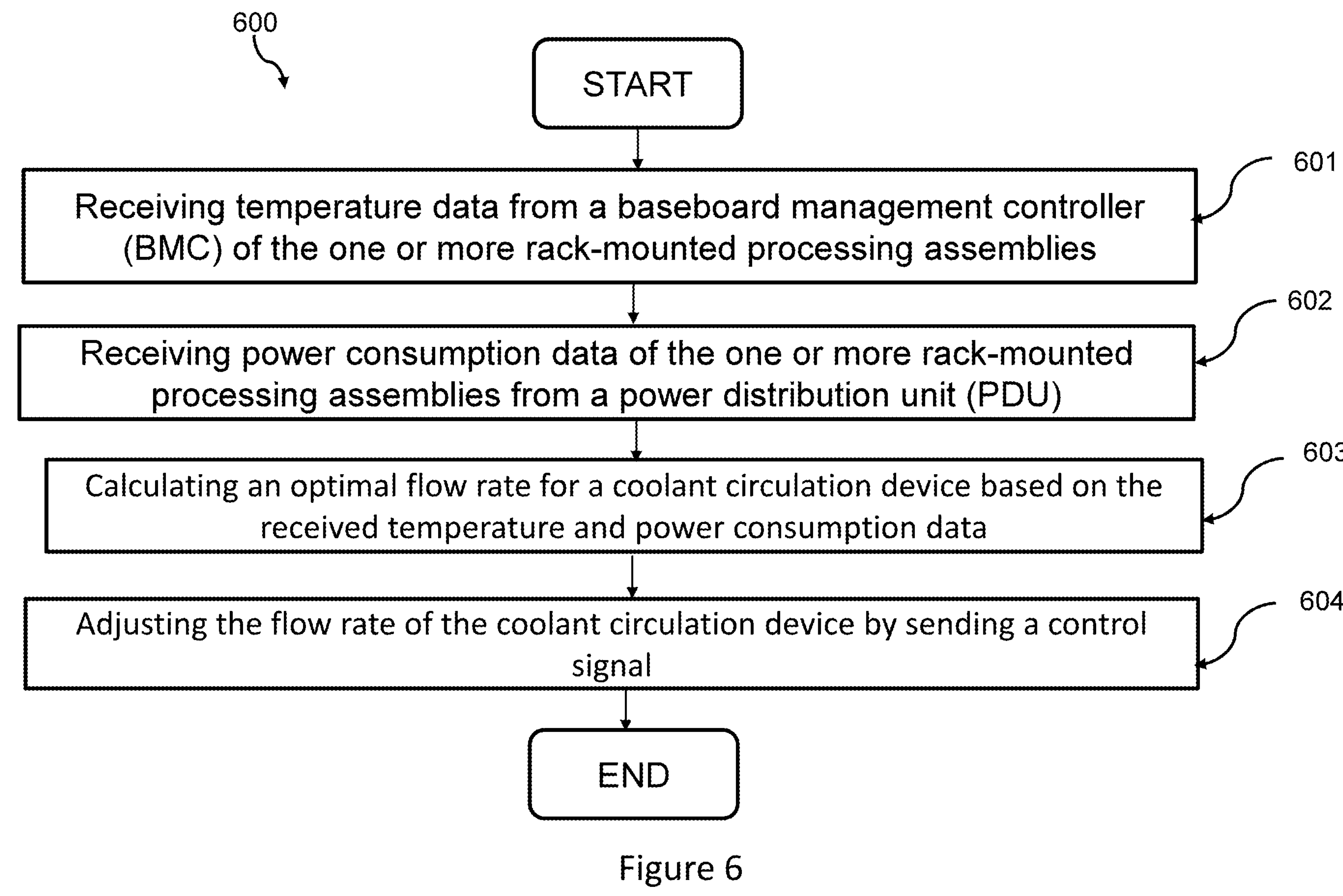
FIG. 6 is flow diagram of a method for optimizing the total power consumption level of one or more rack-mounted processing assemblies in accordance with some implementations of the present technology.

FIG. 6 is a flow diagram of a method 600 for optimizing the total power consumption level of one or more rack-mounted processing assemblies comprising cooling blocks according to some implementations of the present technology. In one or more aspects, the method 600 or one or more steps thereof may be performed by a processor or a computer system, such as the power control unit 11. The method 600 or one or more steps thereof may be embodied in computer-executable instructions that are stored in a computer-readable medium, such as a non-transitory mass storage device, loaded into memory and executed by a CPU. Some steps or portions of steps in the flow diagram may be omitted or changed in order.

The method 600 begins with receiving, at operation 601, by the power control unit 11, temperature data from a baseboard management controller 16 (BMC) of the one or more rack-mounted processing assemblies 13 via a management interface.

In some implementations, the management interface is selected from a group of management interfaces comprising: an Intelligent Platform Management Interface (IPMI) and Redfish.

The method 600 continues with receiving, at operation 602, by the power control unit 11, power consumption data of the one or more rack-mounted processing assemblies 13 from a power distribution unit (PDU) 12.

The method 600 continues with calculating, at operation 603, at the power control unit, power consumption data of the one or more rack-mounted processing assemblies 13 from a power distribution unit (PDU) 12.

In some implementations, the step of calculating the optimal flow rate includes using a static model based on predetermined parameters, or employing a dynamic machine learning model implementing reinforcement learning with predefined exploration/exploitation strategies and reward functions.

The method 600 continues with adjusting, at operation 604, the flow rate of the coolant circulation device by sending a control signal from the power control unit to the coolant circulation device 14 to achieve reduced energy consumption while maintaining the temperature of each rack-mounted processing assembly 13 below a predetermined safety limit.

In some implementations, the control signal is selected from a group of control signals comprising pulse width modulation (PWM) signals and pulse amplitude modulation (PAM) signals.

While the above-described implementations have been described and shown with reference to particular operations performed in a particular order, it will be understood that these steps may be combined, sub-divided, or re-ordered without departing from the teachings of the present technology. At least some of the steps may be executed in parallel or in series. Accordingly, the order and grouping of the steps is not a limitation of the present technology.

It will be appreciated that at least some of the operations of the method 600 may also be performed by computer programs, which may exist in a variety of forms, both active and inactive. Such as, the computer programs may exist as software program(s) comprised of program instructions in source code, object code, executable code or other formats. Any of the above may be embodied on a computer readable medium, which include storage devices and signals, in compressed or uncompressed form. Representative computer readable storage devices include conventional computer system RAM (random access memory), ROM (read only memory), EPROM (erasable, programmable ROM), EEPROM (electrically erasable, programmable ROM), and magnetic or optical disks or tapes. Representative computer readable signals, whether modulated using a carrier or not, are signals that a computer system hosting or running the computer program may be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general.

It should be expressly understood that not all technical effects mentioned herein need to be enjoyed in each and every embodiment of the present technology.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A power management system for optimizing the total power consumption level of one or more rack-mounted server units, the power management system comprising:

a configuration in which each of the server units contains at least one electronic processing assembly, a cooling block configured to provide liquid cooling to the server unit, a power supply unit (PSU) configured to receive electric power for operation of the server unit, and a baseboard management controller (BMC) configured to monitor temperature level data of the server unit;

a coolant distribution loop configured to convey coolant supplied to the cooling blocks of the server units and convey heated coolant received from the cooling blocks of the server units;

a coolant circulation flow device configured to adjust a flow rate of the coolant supplied to the cooling blocks via the coolant distribution loop;

a power distribution unit (PDU), communicably-coupled to each of the PSUs of the server units, and configured to measure power consumption of each of the server units;

a power control unit communicably-coupled to the coolant circulation flow device, the PDU, and the BMCs of the server units, the power control unit configured to:

receive temperature data from the corresponding BMCs of the server units via a management interface which enables communication between the power control unit and the BMCs of the server units;

receive power consumption data of the server units from the PDU;

calculate an optimal flow rate for the coolant circulation flow device, based on the received temperature and power consumption data, to optimize the total power consumption level of the server units to ensure that the temperature of each of the server units remains below a predetermined temperature safety limit; and communicate control instructions to the coolant circulation flow device to adjust the flow rate of the coolant conveyed in the coolant distribution loop in accordance with the calculated optimal flow rate.

2. The power management system of claim 1, wherein the coolant circulation flow device is selected from a group of coolant circulation flow devices comprising: a communicably-coupled pump for liquid coolant and a communicably-coupled fan for gas coolant.

3. The power management system of claim 1, wherein the power control unit is further configured to monitor and dynamically adjust the flow rate of the coolant circulation flow device based on detected changes in the received temperature data of the server units to ensure that the temperature of each of the server units remains below the predetermined temperature safety limit.

4. The power management system of claim 1, wherein the power control unit is further configured to dynamically adjust the flow rate of the coolant circulation flow device based on real-time analysis of processing load data experienced by the server units to ensure that the temperature of each of the server units remains below the predetermined temperature safety limit.

5. The power management system of claim 1, wherein the power control unit is further configured to calculate the optimal flow rate based on the temperature of the coolant supplied to the cooling blocks to ensure that the temperature of each of the server units remains below the predetermined temperature safety limit.

6. A computer-implemented method for optimizing the total power consumption level of one or more rack-mounted server units each including a power supply unit (PSU) for receiving electric power and a baseboard management controller (BMC) for monitoring temperature levels, the method comprising:

receiving, at a power control unit, temperature data from the BMCs of each of the server units via a management interface;

receiving, at the power control unit, power consumption data of the server units from a power distribution unit (PDU) communicatively-coupled to the PSUs of each of the server units;

calculating, by the power control unit, an optimal flow rate for a coolant circulation device based on the received temperature and power consumption data to ensure that the temperature of each of the server units remains below a predetermined temperature safety limit; and adjusting the flow rate of the coolant circulation device, by sending a control signal from the power control unit to the coolant circulation device, to the calculated optimal flow rate to achieve reduced energy consumption while maintaining the temperature of each rack-mounted processing assembly below a predetermined safety limit.

7. The method of claim 6, wherein the control signal is selected from a group of control signals comprising: pulse width modulation (PWM) signals and pulse amplitude modulation (PAM) signals.

8. The method of claim 6, wherein the management interface is selected from a group of management interfaces comprising: an Intelligent Platform Management Interface (IPMI) and Redfish.

9. The method of claim 6, wherein the step of calculating the optimal flow rate includes using a static model based on predetermined parameters, or employing a dynamic machine learning model implementing reinforcement learning with predefined exploration/exploitation strategies and reward functions.

10. A non-transitory computer-readable medium comprising computer-readable instructions that, upon being executed by a system, cause the system to perform method of claim 6.

* * * * *